(12) United States Patent
Wu et al.

(10) Patent No.: US 6,878,621 B2
(45) Date of Patent: Apr. 12, 2005

(54) METHOD OF FABRICATING BARRIERLESS AND EMBEDDED COPPER DAMASCENE INTERCONNECTS

(75) Inventors: Zhen-Cheng Wu, Hsinchu (TW); Lain-Jong Li, Hua-Lien (TW); Yung-Chen Lu, Taipei (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 25 days.

(21) Appl. No.: 10/346,382

(22) Filed: Jan. 17, 2003

(65) Prior Publication Data

US 2004/0142561 A1 Jul. 22, 2004

(51) Int. Cl.$^7$ ............... H01L 21/44; H01L 21/4763
(52) U.S. Cl. ............... 438/638; 438/643; 438/687
(58) Field of Search ............... 438/687, 637–640, 438/636, 643, 653, 783

(56) References Cited

U.S. PATENT DOCUMENTS

| | | | |
|---|---|---|---|
| 6,265,321 B1 | 7/2001 | Chooi et al. | 438/725 |
| 6,323,121 B1 * | 11/2001 | Liu et al. | 438/633 |
| 6,326,079 B1 | 12/2001 | Philippe et al. | 428/325 |
| 6,352,917 B1 | 3/2002 | Gupta et al. | 438/622 |
| 6,358,842 B1 * | 3/2002 | Zhou et al. | 438/633 |
| 6,391,783 B1 * | 5/2002 | Sudijono et al. | 438/700 |
| 6,492,256 B2 * | 12/2002 | Lee et al. | 438/619 |

* cited by examiner

*Primary Examiner*—Ha Tran Nguyen
(74) *Attorney, Agent, or Firm*—Haynes and Boone, LLP

(57) ABSTRACT

A method for forming at least one barrierless, embedded metal structure comprising the following steps. A structure having a patterned dielectric layer formed thereover with at least one opening exposing at least one respective portion of the structure. Respective metal structures are formed within each respective opening. The first dielectric layer is removed to expose the top and at least a portion of the side walls of the respective at least one metal structure. A dielectric barrier layer is formed over the structure and the exposed top of the respective metal structure. A second, conformal dielectric layer is formed over the dielectric barrier layer to complete the respective barrierless at least one metal structure embedded within the second, conformal dielectric layer. The dielectric barrier layer preventing diffusion of the metal comprising the respective at least one metal structure into the second, conformal dielectric layer.

50 Claims, 2 Drawing Sheets

METHOD OF FABRICATING BARRIERLESS AND EMBEDDED COPPER DAMASCENE INTERCONNECTS

FIELD OF THE INVENTION

The present invention relates generally to semiconductor fabrication and more specifically to formation of damascene interconnects.

BACKGROUND OF THE INVENTION

Currently, refractory metals and their nitrided compounds, such as TaN and TiN, are employed as metal barrier layers against copper (Cu) penetration into silicon oxide ($SiO_2$) and low-k dielectric materials (where a low-k dielectric material has a dielectric constant (k) of less than about 3.0). However, beyond 0.1 μm, the main advantage of using low-resistance copper interconnects will be further negated by such high-resistance metal barrier layers resulting in the great increase of total RC (resistance capacitance) time delay.

Moreover, with continually thinning, these metal barrier layers will have reliability concerns such as line-line leakage, time dependent dielectric breakdown (TDDB) lifetime and bias-temperature stress (BTS) due to their poor barrier integrity.

U.S. Pat. No. 6,358,842 B1 to Zhou et al. describes a dual damascene process.

U.S. Pat. No. 6,352,917 B1 to Gupta et al. describes a reverse dual damascene process.

U.S. Pat. No. 6,326,079 B1 to Philippe et al. describes an SiOC barrier layer.

U.S. Pat. No. 6,265,321 B1 to Chooi et al. describes an air bridge process for interconnects.

SUMMARY OF THE INVENTION

Accordingly, it is an object of one or more embodiments of the present invention to provide a method of forming barrierless and embedded damascene interconnects.

Other objects will appear hereinafter.

It has now been discovered that the above and other objects of the present invention may be accomplished in the following manner. Specifically, a structure having at least a first dielectric layer formed thereover is provided. The first dielectric layer is patterned to form at least one opening therethrough and exposing at least one respective portion of the structure. The at least one opening having respective side walls and a bottom. At least one respective metal structure is then formed within each respective at least one opening. The respective at least one metal structure each having respective side walls, a bottom and a top. The first dielectric layer is removed to expose the top and at least a portion of the side walls of the respective at least one metal structure. A dielectric barrier layer is formed over the structure and the exposed top of the respective metal structure. A second, conformal dielectric layer is formed over the dielectric barrier layer to complete the respective barrierless at least one metal structure embedded within the second, conformal dielectric layer. The dielectric barrier layer preventing diffusion of the metal comprising the respective at least one metal structure into the second, conformal dielectric layer.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
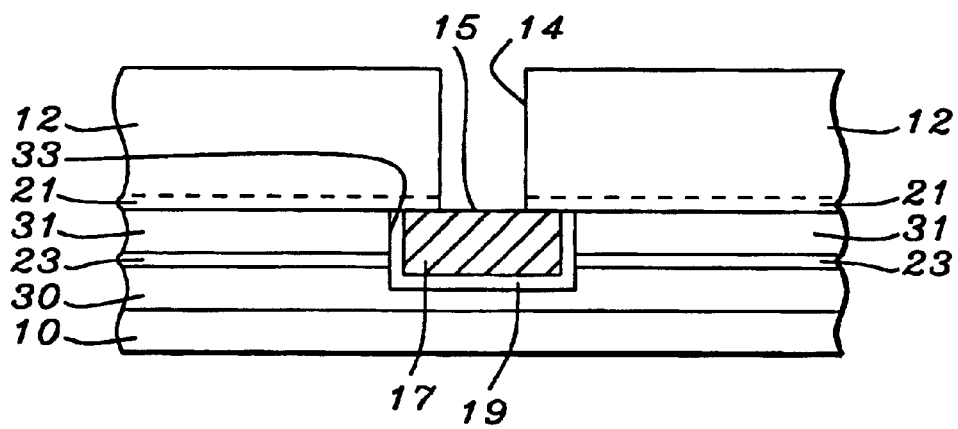
FIGS. 1 to 6 schematically illustrate a preferred embodiment of the present invention.

Initial Structure—FIG. 1

As shown in FIG. 1, a structure 10 is provided having a first dielectric layer 30 formed thereover. An etch stop layer 23 may be formed over first dielectric layer 30 to a thickness of preferably from about 360 to 330 Å, more preferably from about 380 to 420 Å and most preferably about 400 Å. A second dielectric layer 31 may be formed over the etch stop layer 23.

Structure 10 is preferably a silicon substrate or a germanium substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Second dielectric layer 31 is selected from a material that is easily etched away when using $N_2+H_2$ reactant gases. First and second dielectric layers 30, 31 are preferably comprised of a low-k dielectric material and are more preferably a spin-on-low-k dielectric layer such as preferably P-SiLK (a porous low-k material manufactured by the Dow Chemical Company), JSR LKD 5109™, Nanoglass™, Xerogel™ and is more preferably P-SiLK.

For the purposes of this invention, a low-k dielectric material has a dielectric constant (k) of less than about 3.0.

Etch stop layer 23 is preferably formed of $SiO_xC_y$ (not pure SiC), SiCN or SiN and more preferably $SiO_xC_y$ (not pure SiC) where "y" is x−1 and "x" is preferably greater than about 0 and less than about 1.

A trench opening 33 is formed through second dielectric layer 31, etch stop layer 23 and into first dielectric layer 30. Trench opening 33 is preferably lined with trench liner layer 19 to a thickness of from about 90 to 110 Å, more preferably from about 95 to 105 Å and most preferably about 100 Å. Trench liner layer 19 is preferably comprised of SiC, SiCO or SiCN and is more preferably SiC.

A planarized trench metal structure 17 is formed within trench opening 33. Trench metal structure 17 is preferably comprised of copper (Cu).

A barrier layer 21 is then formed over second dielectric layer 31 and planarized trench metal structure 17 to a thickness of preferably from about 400 to 600 Å and more preferably from about 500 to 550 Å. Barrier layer 21 functions as an etch stop layer in the formation of opening 14 (see below) and permits precise critical dimension (CD) control.

Barrier layer 21 is preferably comprised of SiC.

It is noted that the material comprising etch stop layer 23 is selected so as to not be etchable in the same environment as the material comprising barrier layer 21. That is, it is preferred to gain good etching selectivity when etching back.

A third dielectric layer 12 is formed over barrier layer 21 to a thickness of preferably from about 1500 to 2500 Å, more preferably from about 1700 to 2000 Å and most preferably from about 1800 to 1900 Å.

Third dielectric layer 12 is selected from a material that is easily etched away when using $N_2+H_2$ reactant gases. Third dielectric layer 12 is preferably comprised of a low-k dielectric material and is more preferably a spin-on-low-k dielectric layer such as preferably P-SiLK manufactured by the Dow Chemical Company, JSR LKD 5109™, Nanoglass™ or Xerogel™ and is more preferably P-SiLK.

Third dielectric layer 12 and barrier layer 21 are patterned to form an opening 14 exposing a portion 15 of planarized trench metal structure 17. Opening 14 may be a dual damascene opening, a trench opening, a line opening or a via opening as shown in FIG. 1.

Figure 2:
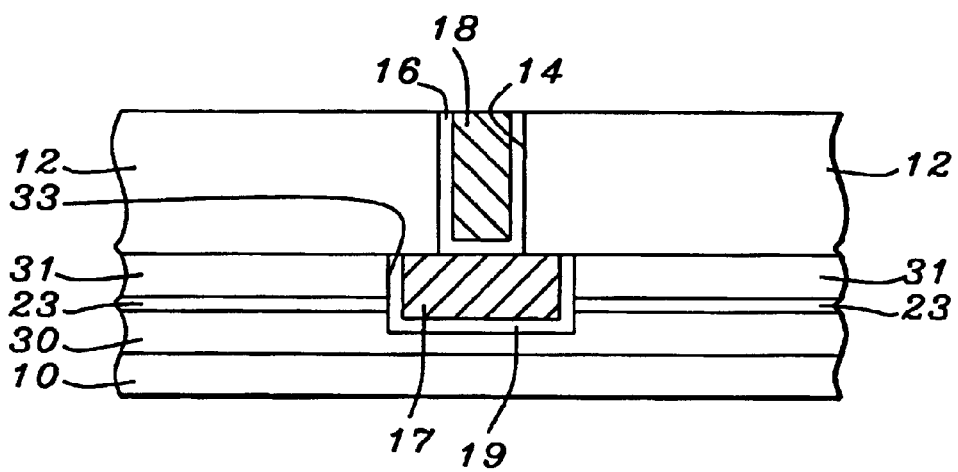

Although barrier layer 21 is shown in FIG. 1 for illustrative purposes (in dashed lines), it is noted that barrier layer 21 is also simultaneously etched away when forming opening 14 as shown in FIG. 2.

Opening 14 has a width that may be as narrow as preferably from about 0.12 to 0.14 $\mu$m and more preferably about 0.13 $\mu$m. Opening 14 may be a via opening and, in conjunction with trench opening 33, may comprise a dual damascene opening.

Formation of Etch-Protection Layer 16 and Metal Via Plug 18 Within Opening 14—FIG. 2

As shown in FIG. 2, a conductive etch-protection layer 16 may be formed within via opening 14, lining the sidewalls of via opening 14 and the exposed portion 15 of the planarized trench metal structure 17. Etch-protection layer 16 has a thickness of preferably from about 45 to 55 Å, more preferably from about 48 to 52 Å and most preferably about 50 Å.

Etch protection layer 16 is not a metal barrier layer because of its thickness, but is comprised of a material so as to protect the metal via plug 18 during the subsequent etch back (see below), and is preferably comprised of a low resistance material such as Ta, Ti, Mo, Cr or W and is more preferably Ta. Although not require, etch protection layer 16 is preferred for process safety due to its ability to protect metal via plug 18 during the subsequent etch back.

A planarized via metal plug 18 is then formed within via opening 14. Planarized via metal plug 18 is preferably comprised of copper.

Figure 3:
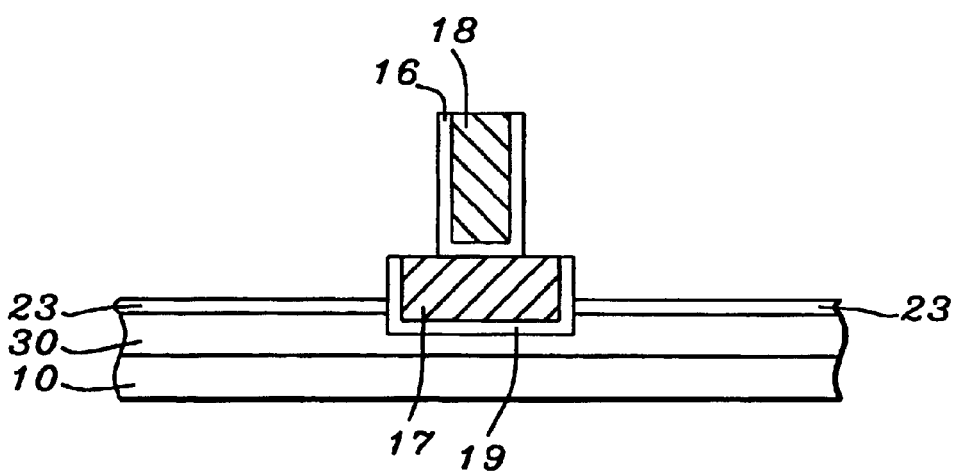

Etch Back to Expose Via Metal Plug 18/Etch Protection Layer 16 and Trench Metal Structure 17/Trench Liner Layer 19 Down to Etch Stop Layer 23—FIG. 3

As shown in FIG. 3, third dielectric layer 12, barrier layer 21 and second dielectric layer 31 are etched back down to the etch stop layer 23 to expose via metal plug 18/etch protection layer 16 and partially expose trench metal structure 17/trench liner layer 19. The etch back employs reactant gasses that etch third and second dielectric layers 12, 31 and barrier layer 21 while not etching etch stop layer 23. It is important that oxygen ($O_2$) not be used or present in the etch back to ensure the copper surfaces are not oxidized. The etch back preferably employs $N_2$ and $H_2$ reactant gasses.

Figure 4:
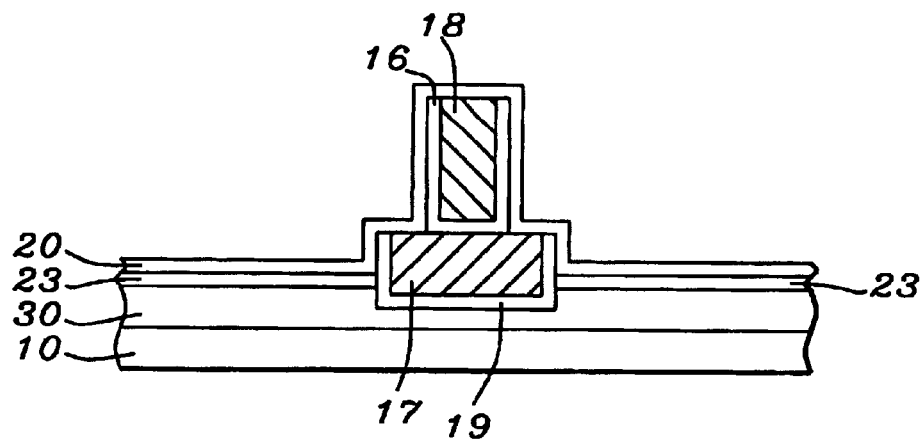

Conformal Deposition of Dielectric Barrier Layer 20—FIG. 4

As shown in FIG. 4, a dielectric barrier layer 20 is conformally and continuously deposited over the structure of FIG. 3 to a thickness of preferably from about 90 to 110 Å, more preferably from about 95 to 105 Å and most preferably about 100 Å. This thickness is selected to be well controlled.

Dielectric barrier layer 20 covers the formerly exposed via metal plug 18/etch protection layer 16, partially exposed trench metal structure 17/trench liner layer 19 down to the etch stop layer 23 and etch stop layer 23.

Dielectric barrier layer 20 is preferably comprised of SiC, SiOC, SiCN or SiN and is more preferably SiC. Dielectric barrier layer 20 is comprised of a material that will not permit diffusion or migration of the metal from the trench metal structure 17 and the metal via plug 18.

Figure 5:
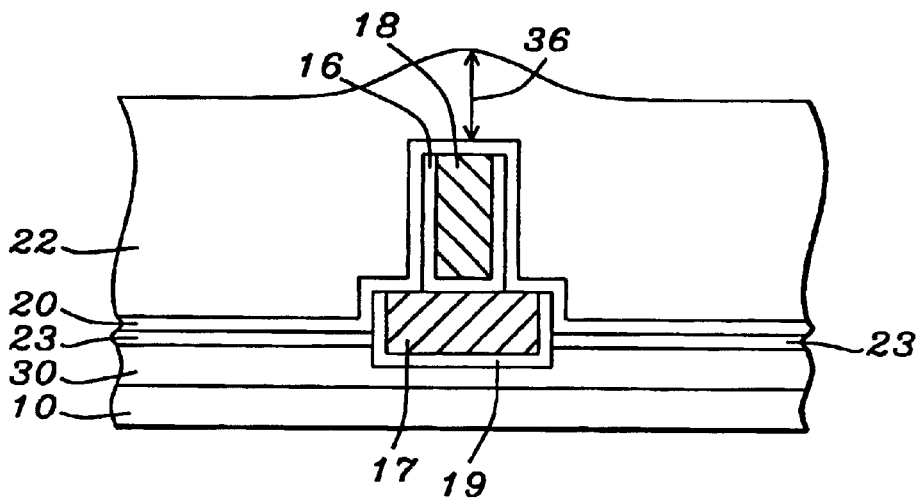

Formation of Fourth Low-k Dielectric Layer 22—FIG. 5

As shown in FIG. 5, a fourth low-k dielectric layer 22 is formed over the dielectric barrier layer 20 to a thickness 36 above the metal via plug 18. Fourth low-k dielectric layer 22 preferably is a spin-on-low-k dielectric material (i.e. a dielectric constant (k) of less than about 3.0) and has excellent conformal coverage and is preferably comprised of P-SiLK, JSR LKD 5109, Nanoglass™ or Xerogel™ and is more preferably P-SiLK.

Fourth low-k dielectric layer 22 has excellent conformal coverage so that narrow gaps between metal/copper lines may be properly filled. Thus, a spin-on coating is preferred.

Figure 6:
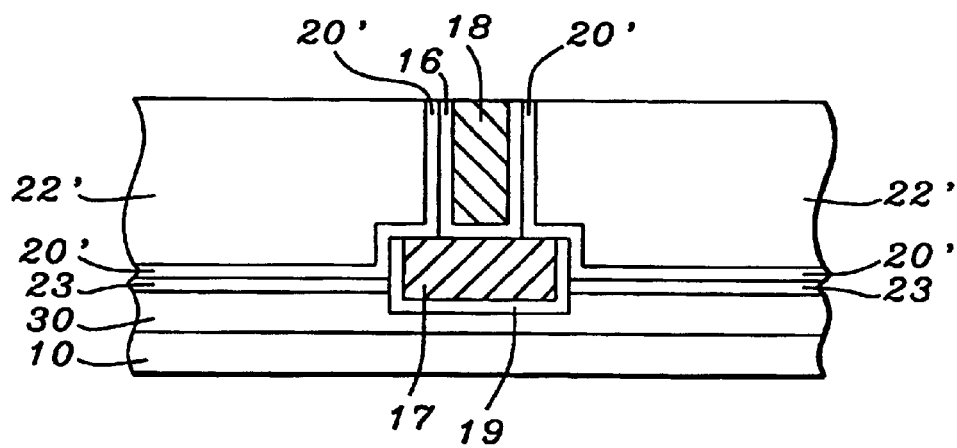

Planarization of Fourth Low-k Dielectric Layer 22—FIG. 6

As shown in FIG. 6, the fourth low-k dielectric layer 22 is planarized to form a planarized fourth low-k dielectric layer 22'. The planarization process, which is preferably a chemical mechanical polishing (CMP) process, also preferably removes the dielectric barrier layer 20 from over the metal via plug 18 so that the height of the planarized fourth low-k dielectric layer 22' is equal to the height of the metal via plug 18 as shown in FIG. 6.

It is noted that there is not an etch stop layer between the metal via plug 18 and the trench metal structure 17. Further the metal via plug 18 and the trench metal structure 17 are embedded within dielectric barrier layer 20, which is more preferably comprised of SiC, so that the metal/metal ions can not diffuse/migrate out into the surrounding fourth low-k dielectric layer 22.

First, second, third and fourth low-k dielectric layers 30, 31, 12, 22 are preferably comprised of the same material and are more preferably each comprised of P-SiLK.

It is noted that the method of the present invention may be employed to form barrierless and embedded metal lines, via plugs, trench structures and other metal structures used in semiconductor fabrication and for other purposes.

Advantages of the Present Invention

The advantages of one or more embodiments of the present invention include:
1. no need for dielectric via-filling and Ar-sputtering at the via bottom;
2. time dependent dielectric breakdown (TDDB) lifetime improvement;
3. electomigration (EM) lifetime enhancement;
4. RC delay reduction; and
5. the method of the present invention is compatible with exiting tools and processes.

While particular embodiments of the present invention have been illustrated and described, it is not intended to limit the invention, except as defined by the following claims.

We claim:

1. A method for forming a metal structure, comprising:
   providing a substrate having at least a first dielectric layer formed thereover and a first metal structure within the first dielectric layer;
   providing a second dielectric layer over the first dielectric layer and the first metal structure;
   patterning the second dielectric layer to form at least one opening there through and exposing at least one portion of the first metal structure; the at least one opening having side walls and a bottom;
   then forming at least one second metal structure within each opening; each second metal structure having side walls, a bottom and a top;
   removing the second dielectric layer and at least a portion of the first dielectric layer to expose the top and at least a portion of the side walls of the second metal structure and at least a portion of the first metal structure;

forming a dielectric barrier layer over the exposed top and side walls of the first and second metal structures; and forming a third, conformal dielectric layer over the dielectric barrier layer to complete the at least one barrierless metal structure; the dielectric barrier layer preventing diffusion from the barrierless metal structure into the third, conformal dielectric layer.

2. The method of claim 1, wherein the substrate is a silicon substrate or a germanium substrate.

3. The method of claim 1, wherein the substrate is a silicon substrate.

4. The method of claim 1, wherein the metal structures are each comprised of copper.

5. The method of claim 1, wherein the second dielectric layer and the third, conformal dielectric layer are each comprised of P-SiLK, JSR LKD 5109.TM., Nanoglass.TM. or Xerogel.TM.

6. The method of claim 1, wherein the second dielectric layer and the third, conformal dielectric layer are comprised of P-SiLK.

7. The method of claim 1, wherein the first dielectric layer, the second dielectric layer and the third, conformal dielectric layer are comprised of a dielectric material having a dielectric constant of less than about 3.0.

8. The method of claim 1, wherein the second dielectric layer has a thickness of from about 1500 to 2500 Å; and the dielectric barrier layers each have a thickness of about 90 to 105 Å.

9. The method of claim 1, wherein the second dielectric layer has a thickness of from about 1700 to 2000 Å; and the dielectric barrier layers each have a thickness of about 95 to 105 Å.

10. The method of claim 1, wherein the second dielectric layer has a thickness of about 1800 to 1900 Å; and the dielectric barrier layers each have a thickness of about 100 Å.

11. The method of claim 1, wherein the at least one opening has a width of from about 0.12 to 0.14 $\mu$m.

12. The method of claim 1, wherein the at least one opening has a width of about 0.13 $\mu$m.

13. The method of claim 1, wherein the first and second dielectric layers are etched back using a process employing N2 and H2 reactant gasses.

14. The method of claim 1, including the step of planarizing the third, conformal dielectric layer to form a planarized third, conformal dielectric layer.

15. The method of claim 1, including the step of planarizing the third, conformal dielectric layer by a CMP process to form a planarized third, conformal dielectric layer.

16. The method of claim 1, wherein the barrierless metal structure is incorporated into a dual damascene structure.

17. The method of claim 1, wherein the opening is a dual damascene opening.

18. The method of claim 1, wherein the opening is a via opening.

19. The method of claim 1, wherein the opening is a trench or line opening.

20. The method of claim 1, wherein the first and second dielectric layers are etched back using an oxygen-free process.

21. The method of claim 1, including the step of forming etch-protection layers within each opening, covering the respective side walls and bottom of each opening; the etch-protection layers not being a metal barrier layer.

22. The method of claim 1, including the step of forming etch-protection layers within each opening, covering the respective side walls and bottom of each opening; the etch-protection layers each comprised of Ta, Ti, Mo, Cr or W.

23. The method of claim 1, including the step of forming etch-protection layers within each opening, covering the respective side walls and bottom of each opening; the etch-protection layers each comprised of Ta.

24. The method of claim 1, including the step of forming etch-protection layers within each opening, covering the respective side walls and bottom of each opening; the etch-protection not being a metal barrier layer each having a thickness of about 45 to 55 Å.

25. The method of claim 1, including the step of forming etch-protection layers within each opening, covering the respective side walls and bottom of each opening; the etch-protection layers not being a metal barrier layer and each having a thickness of about 48 to 52 Å.

26. The method of claim 1, including the step of forming etch-protection layers within each opening, covering the respective side walls and bottom of each opening; the etch-protection layers not being a metal barrier layer and each having a thickness of about 50 Å.

27. The method of claim 1, wherein the dielectric barrier layer encapsulates the at least a portion of the barrierless metal structure; the dielectric barrier layer being comprised of SiC, SiOC, SiGN or SiN.

28. The method of claim 1, wherein the dielectric barrier layer encapsulates the at least a portion of the barrierless metal structure; the dielectric barrier layer being comprised of SiC.

29. A method for forming at least one barrierless, embedded metal structure, comprising the steps of:

providing a substrate having at least a first dielectric layer formed there over and a first metal structure within the first dielectric layer;

patterning the first dielectric layer to form at least one dual damascene opening there through and exposing at least one portion of the first metal structure; the at least one dual damascene opening having side walls and a bottom;

forming an etch-protection layer within each dual damascene opening, covering the respective side walls and bottom of each dual damascene opening; the etch-protection layer not being a metal barrier layer;

then forming a second metal structure within each dual damascene opening, each second metal structure having respective side walls, a bottom and a top;

etching the first dielectric layer back to expose at least a portion of the etch-protection layer surrounding the side walls and bottom of the second metal structure;

forming a dielectric barrier layer over the etch-protection layer and the top of the respective second metal structure; and forming a second, conformal dielectric layer over the dielectric barrier layer to complete the barrierless metal structure; the dielectric barrier layer preventing diffusion of metal from the second metal structure into the second, conformal dielectric layer.

30. The method of claim 29, wherein the substrate is a silicon substrate or a germanium substrate.

31. The method of claim 29, wherein the substrate is a silicon substrate.

32. The method of claim 29, wherein the barrierless metal structures are each comprised of copper.

33. The method of claim 29, wherein the first dielectric layer and the second, conformal dielectric layer are each comprised of P-SiLK, JSR LKD 5109.TM., Nanoglass.TM. or Xerogel.TM.

34. The method of claim 29, wherein the first dielectric layer and the second, conformal dielectric layer are comprised of P-SiLK.

35. The method of claim 29, wherein the first dielectric layer and the second, conformal dielectric layer are comprised of a dielectric material having a dielectric constant of less than about 3.0.

36. The method of claim 29, wherein the respective etch-protection layers are each comprised of Ta, Ti, Mo, Cr or W.

37. The method of claim 29, wherein the respective etch-protection layers are each comprised of Ta.

38. The method of claim 29, wherein the first dielectric layer has a thickness of about 1500 to 2500 Å; the respective etch-protection layers each have a thickness of about 45 to 55 Å; and the respective dielectric barrier layers each have a thickness of about 90 to 110 Å.

39. The method of claim 29, wherein the first dielectric layer has a thickness of about 1700 to 2000 Å; the respective etch-protection layers each have a thickness of about 48 to 52 Å; and the respective dielectric barrier layers each have a thickness of about 95 to 105 Å.

40. The method of claim 29, wherein the first dielectric layer has a thickness of about 1800 to 1900 Å; each of the etch-protection layers have a thickness of about 50 Å; and the dielectric barrier layers each have a thickness of about 100 Å.

41. The method of claim 29, wherein the at least one dual damascene opening has an upper width of about 0.12 to 0.14 $\mu$m.

42. The method of claim 29, wherein the at least one dual damascene opening has an upper width of about 0.13 $\mu$m.

43. The method of claim 29, wherein the first dielectric layer is etched back using a process employing N2 and H2 reactant gasses.

44. The method of claim 29, including the step of planarizing the second, conformal dielectric layer to form a planarized second, conformal dielectric layer.

45. The method of claim 29, including the step of planarizing the second, conformal dielectric layer by a CMP process to form a planarized second, conformal dielectric layer.

46. The method of claim 29, wherein the barrierless metal structure is incorporated into a dual damascene structure.

47. The method of claim 29, wherein the first dielectric layer is etched back using an oxygen-free process.

48. The method of claim 29, wherein the dielectric barrier layer encapsulates the respective second metal structure; the dielectric barrier layer being comprised of SiC, SiOC, SiGN or SiN.

49. The method of claim 29, wherein the dielectric barrier layer encapsulates the respective second metal structure; the dielectric barrier layer being comprised of SiC.

50. A method for forming metal structure, comprising:

providing a substrate having a first dielectric layer formed there-over and a first metal structure within the first dielectric layer, providing a second dielectric layer over the first dielectric layer with a second metal structure within the second dielectric layer, the second metal contacting the first metal;

removing the second dielectric layer to expose a top and at least a portion of side walls of the second metal structure and at least a portion of the first metal structure;

forming a barrier layer over the exposed top and side walls of the second metal structure and the portion of the first metal structures; and forming a third dielectric layer over the barrier layer to complete the metal structure embedded within the third dielectric layer, the barrier layer preventing diffusion of metal from the metal structure into the third dielectric layer.

* * * * *